United States Patent
Lv et al.

(10) Patent No.: US 10,204,583 B2
(45) Date of Patent: Feb. 12, 2019

(54) GATE DRIVER ON ARRAY DRIVING CIRCUIT AND LCD DEVICE

(71) Applicant: SHENZHEN CHINA STAR OPTOELECTRONICS TECHNOLOGY CO., LTD., Guangdong (CN)

(72) Inventors: Xiaowen Lv, Guangdong (CN); Shujhih Chen, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 203 days.

(21) Appl. No.: 15/326,014

(22) PCT Filed: Dec. 14, 2016

(86) PCT No.: PCT/CN2016/109868
§ 371 (c)(1),
(2) Date: Jan. 12, 2017

(87) PCT Pub. No.: WO2018/072288
PCT Pub. Date: Apr. 26, 2018

(65) Prior Publication Data
US 2018/0268768 A1    Sep. 20, 2018

(30) Foreign Application Priority Data
Oct. 18, 2016  (CN) ............................ 2016 1 0906745

(51) Int. Cl.
*G09G 3/36* (2006.01)
*H01L 27/12* (2006.01)
*G02F 1/1368* (2006.01)

(52) U.S. Cl.
CPC .......... *G09G 3/3677* (2013.01); *G02F 1/1368* (2013.01); *H01L 27/124* (2013.01); *G09G 2310/0264* (2013.01)

(58) Field of Classification Search
CPC ..... G09G 3/3677; G11C 19/00; G02F 1/1368; H01L 27/124
See application file for complete search history.

(56) References Cited

U.S. PATENT DOCUMENTS

| | | | |
|---|---|---|---|
| 9,460,676 B2* | 10/2016 | Dai | G11C 19/287 |
| 10,019,956 B2* | 7/2018 | Tu | G09G 3/3648 |
| 2012/0153996 A1* | 6/2012 | Su | G09G 3/3659 327/109 |
| 2015/0255034 A1* | 9/2015 | Hong | G09G 3/3674 345/214 |
| 2016/0140926 A1* | 5/2016 | Xiao | G09G 3/3677 345/215 |
| 2016/0189649 A1* | 6/2016 | Xiao | G11C 19/28 345/214 |

* cited by examiner

*Primary Examiner* — Sardis F Azongha
(74) *Attorney, Agent, or Firm* — WPAT, PC

(57) ABSTRACT

The present disclosure provides a gate driver on array (GOA) driving circuit and a liquid crystal display (LCD) device. The GOA driving circuit comprises a plurality of cascaded GOA units. An Nth cascaded GOA unit outputs a gate driving signal to an Nth horizontal scanning line Gn of an display area. The Nth cascaded GOA unit comprises a pull-up assembly, a pull-up control assembly, a pull-down maintaining assembly, a download assembly and a bootstrap capacitor assembly.

12 Claims, 1 Drawing Sheet

GATE DRIVER ON ARRAY DRIVING CIRCUIT AND LCD DEVICE

BACKGROUND OF THE INVENTION

1. Field of the Invention

The present disclosure relates to the field of liquid crystal displays (LCDs), and more particularly to a gate driver on array (GOA) driving circuit and an LCD device.

2. Description of the Prior Art

A gate driver on array circuit, abbreviated as GOA circuit, uses a scan driving circuit that is formed on an array substrate by processing of an array substrate of a traditional thin film transistor-liquid crystal display (TFT-LCD), thus, a driving method for scanning a pixel structure row by row is achieved.

In prior art, a thin film transistor (TFT) of the GOA circuit usually uses indium gallium zinc oxide (IGZO). A threshold voltage (Vth) of the IGZO easily generates drift, and a pull-up control unit of the TFT easily causes current leakage of a gate signal node (Q) because the threshold voltage (Vth) of the IGZO generates drift, thus affecting the GOA circuit.

Therefore, the prior art is defective and needs to be improved and developed.

SUMMARY OF THE INVENTION

The aim of the present disclosure is to provide an improved gate driver on array (GOA) circuit and an improved liquid crystal display (LCD) device.

In order to solve the above issue, the present disclosure provide a technical scheme as follow:

The present disclosure provides a gate driver on array (GOA) driving circuit, where the GOA driving circuit comprises: a plurality of cascaded GOA units. An Nth cascaded GOA unit outputs a gate driving signal to an Nth horizontal scanning line Gn of an display area. The Nth cascaded GOA unit comprises a pull-up assembly, a pull-up control assembly, a pull-down maintaining assembly, a download assembly and a bootstrap capacitor assembly; the pull-up assembly, the pull-down maintaining assembly, and the bootstrap capacitor assembly are all electrically coupled with an Nth gate signal node Qn and the Nth horizontal scanning line Gn. The pull-up control assembly and the download assembly are coupled with the Nth gate signal node Qn.

The pull-up control assembly comprises a first thin film transistor (TFT), a second TFT, and a third TFT. A source electrode of the first TFT and a drain electrode of the second TFT are both coupled with a drain electrode of the third TFT, a source electrode of the second TFT and a gate electrode of the third TFT are both coupled with the Nth gate signal node Qn, and a source electrode of the third TFT is coupled with the pull-down maintaining assembly. A first high frequency clock signal is input to a gate electrode of the first TFT coupled with a gate electrode of the second TFT.

The pull-down maintaining assembly is coupled with a reference low voltage source. When the Nth horizontal scanning line Gn is not active, the pull-down maintaining assembly conducts the Nth cascaded gate signal node and the Nth horizontal scanning line with the reference low voltage source to pull down voltage potentials of the Nth cascaded gate signal node Qn and the Nth horizontal scanning line Gn to a low level. The source electrode of the third TFT is conducted with the reference low voltage source to pull down the source electrode of the third TFT to the low level.

Furthermore, the pull-down maintaining assembly comprises two pull-down maintaining elements, each pull-down maintaining element comprises a fourth TFT, a sixth TFT, a seventh TFT, an eighth TFT, a ninth TFT, and a tenth TFT.

Furthermore, a low frequency clock signal is input to a drain electrode of the eighth TFT coupled with a drain electrode and a gate electrode of the seventh TFT. A first node is coupled to a source electrode of the seventh TFT, a gate electrode of the eighth TFT, and a drain electrode of the tenth TFT. A second node is couple with a source electrode of the eighth TFT, a drain electrode of the ninth TFT, a gate electrode of the fourth TFT, and a gate electrode of the sixth TFT. The source electrodes of the fourth TFT, the sixth TFT, and the tenth TFT are coupled, and a first low voltage output by the reference low voltage source is input to the source electrodes of the fourth TFT, the sixth TFT, and the tenth TFT. A second low voltage output by the reference low voltage source is input to the source electrode of the ninth TFT. The Nth cascaded gate signal node Qn is couple with the drain electrode of the fourth TFT, a gate electrode of the ninth TFT, and a gate electrode of the tenth TFT. The drain electrode of the sixth TFT is coupled with the source electrode of the third TFT and the Nth horizontal scanning line Gn, respectively. Two low frequency clock signals are input to the two pull-down maintaining elements, respectively, and phases of the two low frequency clock signals are inverted.

Furthermore, the two low frequency clock signals are input to the two pull-down maintaining elements by different common metal wires, respectively.

Furthermore, the download assembly comprises a eleventh TFT. A second high frequency clock signal is input to a drain electrode of the eleventh TFT, a gate electrode of the eleventh TFT is coupled with the Nth gate signal node Qn, and a source electrode of the eleventh TFT outputs an Nth download signal STn.

Each pull-down maintaining element further comprises a fifth TFT. A gate electrode of the fifth TFT is coupled with the second node, a drain electrode of the fifth TFT is coupled with the source electrode of the eleventh TFT, and the first low voltage is input to a source of the fifth TFT.

Furthermore, value of the second low voltage is less than value of the first low voltage.

Furthermore, the pull-up assembly comprises a twelfth TFT, where a second high frequency clock signal is input to a drain electrode of the twelfth TFT, a source electrode of the twelfth TFT is coupled with the Nth horizontal scanning line Gn, and a gate electrode of the twelfth TFT is coupled with the Nth gate signal node.

Furthermore, the first high frequency clock signal is inverted to a second high frequency clock signal.

Furthermore, the bootstrap capacitor assembly comprises a bootstrap capacitor. A first end of the bootstrap capacitor is coupled with the Nth cascaded gate signal node Qn, and a second end of the bootstrap capacitor Cb is coupled to the Nth horizontal scanning line Gn.

Furthermore, the first TFT, the second TFT, the third TFT are all made of indium gallium zinc oxide (IGZO).

The present disclosure further comprises an LCD device comprises any one of the above GOA driving circuit.

The present disclosure provides the pull-up control assembly of the GOA driving circuit, where the pull-up control assembly comprises the first TFT, the second TFT, and the third TFT. The source electrode of the first TFT and the drain electrode of the second TFT are both coupled with the drain electrode of the third TFT, the source electrode of the second TFT and the gate electrode of the third TFT are both coupled with the Nth gate signal node Qn, and the source electrode of the third TFT is coupled with the pull-down maintaining assembly. The first high frequency clock signal is input to the gate electrode of the first TFT coupled with the gate electrode of the second TFT. When the Nth horizontal scanning line Gn is not active. The pull-down maintaining assembly conducts the source electrode of the third TFT with the reference low voltage source, thus, voltage potentials of the source electrode of the third TFT is pulled down to the low level, which avoids the current leakage of the gate signal node of the pull-up maintaining assembly. In addition, number of the TFT is decreased because of no the pull-down assembly.

DETAILED DESCRIPTION OF THE PREFERRED EMBODIMENTS

Figure 1:
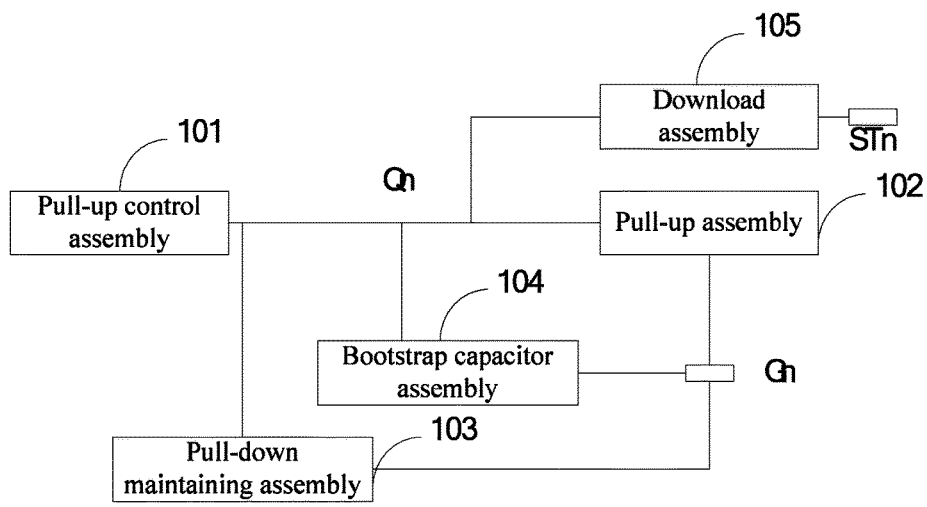
FIG. 1 is a functional block diagram of an Nth cascaded GOA unit of a gate driver on array (GOA) circuit according to a embodiment of the present disclosure.

The following description of every embodiment with reference to the accompanying drawings is used to exemplify a specific embodiment, which may be carried out in the present invention. Directional terms mentioned in the present invention, such as "top", "bottom", "front", "back", "left", "right", "inside", "outside", "side" etc., are only used with reference to the orientation of the accompanying drawings. Therefore, the used directional terms are intended to illustrate, but not to limit, the present invention.

In the drawings, the components having similar structures are denoted by the same numerals.

As shown in FIG. 1, the GOA driving circuit comprises a plurality of cascaded GOA units, where an Nth cascaded GOA unit outputs a gate driving signal to an Nth horizontal scanning line Gn of an display area, where the Nth cascaded GOA unit comprises a pull-up control assembly 101, a pull-up assembly 102, a pull-down maintaining assembly 103, a download assembly 105, and a bootstrap capacitor assembly 104.

The pull-up assembly 102, the pull-down maintaining assembly 103, and the bootstrap capacitor assembly 104 are all electrically coupled with an Nth gate signal node Qn and the Nth horizontal scanning line Gn. The pull-up control assembly 101 is coupled with the Nth gate signal node Qn, and the download assembly 105 is coupled with the Nth gate signal node Qn.

Figure 2:
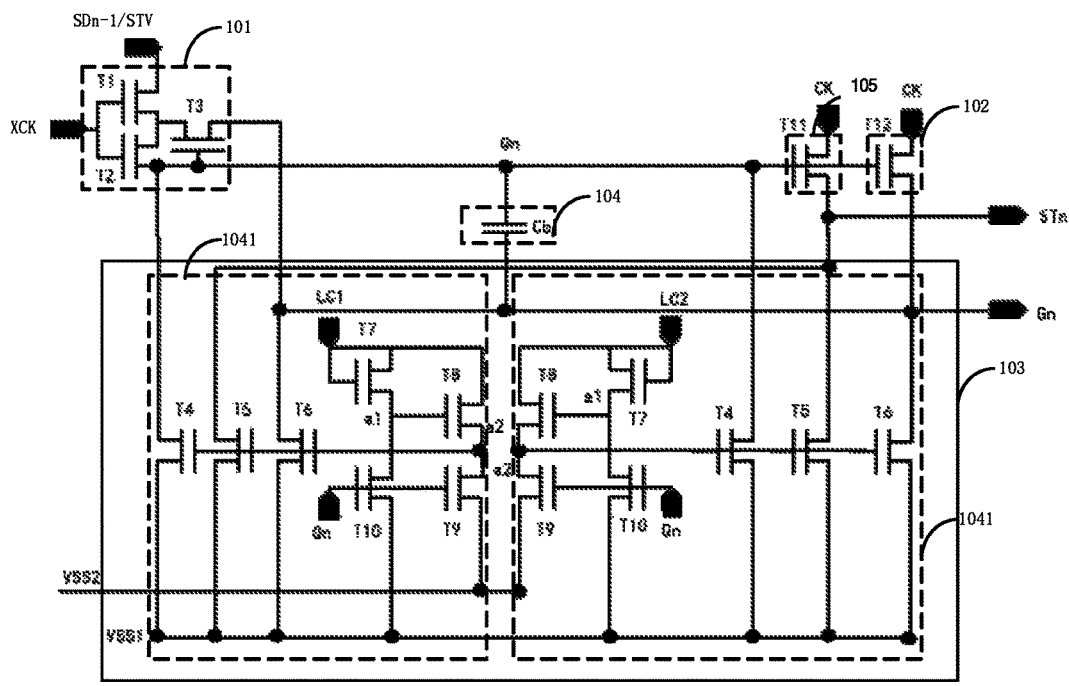
FIG. 2 is a structural diagram of the Nth cascaded GOA unit of the GOA circuit as shown in FIG. 1 according to the embodiment of the present disclosure.

As shown in FIG. 1 and FIG. 2, to be specific, the pull-up assembly 102 comprises a twelfth thin film transistor (TFT) T12, where a second high frequency clock signal CK is input to a drain electrode of the twelfth TFT T12, a source electrode of the twelfth TFT T12 is coupled with the Nth horizontal scanning line Gn, and a gate electrode of the twelfth TFT T12 is coupled with the Nth gate signal node Qn. The pull-up assembly 102 is used to output the gate scanning signal to the Nth horizontal scanning line Gn according to the second high frequency clock signal CK.

The download assembly 105 comprises a eleventh TFT T11, where the second high frequency clock signal CK is input to a drain electrode of the eleventh TFT T11, a gate electrode of the eleventh TFT T11 is coupled with the Nth gate signal node Qn, and a source electrode of the eleventh TFT T11 outputs an Nth download signal STn to the pull-up control assembly 101 of an (N+1)th cascaded GOA unit.

The pull-up control assembly 101 is used to control conduction times of the twelfth TFT T12 of the pull-up assembly 102 and the eleventh TFT T11 of the download assembly 105.

The pull-up control assembly 101 comprises a first TFT T1, a second TFT T2, and a third TFT T3, where a source electrode of the first TFT T1 and a drain electrode of the second TFT T2 are both coupled with a drain electrode of the third TFT T3, a source electrode of the second TFT T2 and a gate electrode of the third TFT T3 are both coupled with the Nth gate signal node Qn, and a source electrode of the third TFT T3 is coupled with the pull-down maintaining assembly 103. A first high frequency clock signal XCK is input to a gate electrode of the first TFT T1 coupled with a gate electrode of the second TFT T2. When the Nth cascaded GOA unit is a first cascaded GOA unit, a starting signal STV is input to a drain electrode of the first TFT T1. When the Nth cascaded GOA unit is not the first cascaded GOA unit, the gate electrode of the first TFT T1 is coupled with the gate electrode of the second TFT T2, and the drain electrode of the first TFT T1 is coupled with the download assembly 105 of an (N−1)th GOA unit to receive a download signal STn−1 where the download signal is sent by the download assembly 105.

The bootstrap capacitor assembly 104 comprises a bootstrap capacitor Cb, where a first end of the bootstrap capacitor Cb is coupled with the Nth cascaded gate signal node Qn, and a second end of the bootstrap capacitor Cb is coupled to the Nth horizontal scanning line Gn.

The pull-down maintaining assembly 103 is coupled with a reference low voltage source, and when the Nth horizontal scanning line Gn is not active, the pull-down maintaining assembly 103 conducts the Nth cascaded gate signal node Qn and the Nth horizontal scanning line Gn with the reference low voltage source, thus, voltage potentials of the Nth cascaded gate signal node Qn and the Nth horizontal scanning line Gn is pulled down to a low level (logic 0). The source electrode of the third TFT T3 is conducted with the reference low voltage source, thus, the source electrode of the third TFT T3 is pulled down to the low level.

To be specific, the pull-down maintaining assembly 103 comprises two pull-down maintaining elements 1031 having a same structure.

Each pull-down maintaining element 1031 both comprises a fourth TFT T4, a fifth TFT T5, a sixth TFT T6, a seventh TFT T7, an eighth TFT T8, a ninth TFT T9, and a tenth TFT T10.

A low frequency clock signal LC1/LC2 is input to a drain electrode of the eighth TFT T8 coupled with a drain electrode and a gate electrode of the seventh TFT T7. A first node a1 is coupled to a source electrode of the seventh TFT T7, a gate electrode of the eighth TFT T8, and a drain electrode of the tenth TFT T10. A second node a2 is couple with a source electrode of the eighth TFT T8, a drain electrode of the ninth TFT T9, a gate electrode of the fourth TFT T4, a gate electrode of the fifth TFT T5, and a gate electrode of the sixth TFT T6. Switches of the fourth TFT T4, the fifth TFT T5, and the sixth TFT T6 are controlled by voltage of the second node a2.

The source electrodes of the fourth TFT T4, the fifth TFT T5, the sixth TFT T6, and the tenth TFT T10 are coupled. A first low voltage VSS1 output by the reference low voltage source is input to the source electrodes of the fourth TFT T4, the fifth TFT T5, the sixth TFT T6, and the tenth TFT T10. A second low voltage VSS2 output by the reference low voltage source is input to the source electrode of the ninth TFT T9. The Nth cascaded gate signal node Qn is couple with the drain electrode of the fourth TFT T4, a gate electrode of the ninth TFT T9, and a gate electrode of the tenth TFT T10. The drain electrode of the sixth TFT T6 is coupled with the source electrode of the third TFT T3 and the Nth horizontal scanning line Gn. The drain electrode of the fifth TFT T5 is coupled with a source electrode of the eleventh TFT T11. Value of the second low voltage is less than value of the first low voltage, thus, further avoiding the current leakage of the gate single node.

The first TFT T1 to the twelfth TFT T12 are all made of indium gallium zinc oxide (IGZO).

The low frequency clock signal LC1 and the low frequency clock signal LC2 are input to the two pull-down maintaining elements 1031 by different common metal wires, respectively, where phases of the low frequency clock signal LC1 and the low frequency clock signal LC2 are inverted. Thus, the two pull-down maintaining elements 1031 alternatively operate, which avoids the TFT from losing efficacy because of voltage stress.

The present disclosure provides the pull-up control assembly of the GOA driving circuit, where the pull-up control assembly comprises the first TFT, the second TFT, and the third TFT. The source electrode of the first TFT and the drain electrode of the second TFT are both coupled with the drain electrode of the third TFT, the source electrode of the second TFT and the gate electrode of the third TFT are both coupled with the Nth gate signal node Qn, and the source electrode of the third TFT is coupled with the pull-down maintaining assembly. The first high frequency clock signal is input to the gate electrode of the first TFT coupled with the gate electrode of the second TFT. When the Nth horizontal scanning line Gn is not active. The pull-down maintaining assembly conducts the source electrode of the third TFT with the reference low voltage source, thus, voltage potentials of the source electrode of the third TFT is pulled down to the low level, which avoids the current leakage of the gate signal node of the pull-up maintaining assembly. In addition, number of the TFT is decreased because of no pull-down assembly.

As the above, it should be understood that the present disclosure has been described with reference to certain preferred and alternative embodiments which are intended to be exemplary only and do not limit the full scope of the present disclosure as set fourth in the appended claims.

What is claimed is:

1. A gate driver on array (GOA) driving circuit, comprising:
    a plurality of cascaded GOA units; an Nth cascaded GOA unit outputs a gate driving signal to an Nth horizontal scanning line Gn of a display area;
    wherein the Nth cascaded GOA unit comprises a pull-up assembly, a pull-up control assembly, a pull-down maintaining assembly, a download assembly and a bootstrap capacitor assembly; the pull-up assembly, the pull-down maintaining assembly, and the bootstrap capacitor assembly are all electrically coupled with an Nth gate signal node Qn and the Nth horizontal scanning line Gn; the pull-up control assembly and the download assembly are coupled with the Nth gate signal node Qn;
    wherein the pull-up control assembly comprises a first thin film transistor (TFT), a second TFT, and a third TFT; a source electrode of the first TFT and a drain electrode of the second TFT are both coupled with a drain electrode of the third TFT, a source electrode of the second TFT and a gate electrode of the third TFT are both coupled with the Nth gate signal node Qn, and a source electrode of the third TFT is coupled with the pull-down maintaining assembly; a first high frequency clock signal is input to a gate electrode of the first TFT coupled with a gate electrode of the second TFT;
    wherein the pull-down maintaining assembly is coupled with a reference low voltage source; when the Nth horizontal scanning line Gn is not active, the pull-down maintaining assembly conducts the Nth cascaded gate signal node and the Nth horizontal scanning line with the reference low voltage source to pull down voltage potentials of the Nth cascaded gate signal node Qn and the Nth horizontal scanning line Gn to a low level; the source electrode of the third TFT is conducted with the reference low voltage source to pull down the source electrode of the third TFT to the low level.

2. The GOA driving circuit as claimed in claim 1, wherein the pull-down maintaining assembly comprises two pull-down maintaining elements, each pull-down maintaining element comprises a fourth TFT, a sixth TFT, a seventh TFT, an eighth TFT, a ninth TFT, and a tenth TFT;
    wherein a low frequency clock signal is input to a drain electrode of the eighth TFT coupled with a drain electrode and a gate electrode of the seventh TFT; a first node is coupled to a source electrode of the seventh TFT, a gate electrode of the eighth TFT, and a drain electrode of the tenth TFT; a second node is couple with a source electrode of the eighth TFT, a drain electrode of the ninth TFT, a gate electrode of the fourth TFT, and a gate electrode of the sixth TFT; the source electrodes of the fourth TFT, the sixth TFT, and the tenth TFT are coupled; a first low voltage output by the reference low voltage source is input to the source electrodes of the fourth TFT, the sixth TFT, and the tenth TFT; a second low voltage output by the reference low voltage source is input to the source electrode of the ninth TFT; the Nth cascaded gate signal node Qn is couple with the drain electrode of the fourth TFT, a gate electrode of the ninth TFT, and a gate electrode of the tenth TFT; the drain electrode of the sixth TFT is coupled with the source electrode of the third TFT and the Nth horizontal scanning line Gn, respectively; two low frequency clock signals are input to the two pull-down maintaining elements, respectively, and phases of the two low frequency clock signals are inverted.

3. The GOA driving circuit as claimed in claim 2, wherein the two low frequency clock signals are input to the two pull-down maintaining elements by different common metal wires, respectively.

4. The GOA driving circuit as claimed in claim 2, wherein the download assembly comprises an eleventh TFT; a second high frequency clock signal is input to a drain electrode of the eleventh TFT, a gate electrode of the eleventh TFT is coupled with the Nth gate signal node Qn, and a source electrode of the eleventh TFT outputs an Nth download signal STn; wherein each pull-down maintaining element further comprises a fifth TFT; a gate electrode of the fifth TFT is coupled with the second node, a drain electrode of the fifth TFT is coupled with the source electrode of the eleventh TFT, and the first low voltage is input to a source of the fifth TFT.

5. The GOA driving circuit as claimed in claim 4, wherein value of the second low voltage is less than value of the first low voltage.

6. The GOA driving circuit as claimed in claim 5, wherein the pull-up assembly comprises a twelfth TFT, where a second high frequency clock signal is input to a drain electrode of the twelfth TFT, a source electrode of the twelfth TFT is coupled with the Nth horizontal scanning line Gn, and a gate electrode of the twelfth TFT is coupled with the Nth gate signal node.

7. The GOA driving circuit as claimed in claim 6, wherein the first high frequency clock signal is inverted to the second high frequency clock signal.

8. The GOA driving circuit as claimed in claim 1, wherein the bootstrap capacitor assembly comprises a bootstrap capacitor, a first end of the bootstrap capacitor is coupled with the Nth cascaded gate signal node Qn, and a second end of the bootstrap capacitor Cb is coupled to the Nth horizontal scanning line Gn.

9. The GOA driving circuit as claimed in claim 1, wherein the first TFT, the second TFT, the third TFT are all made of indium gallium zinc oxide (IGZO).

10. A liquid crystal display (LCD) device, comprising the gate driver on array (GOA) driving circuit as in claim 1.

11. A gate driver on array (GOA) driving circuit, comprising: a plurality of cascaded GOA units; an Nth cascaded GOA unit outputs a gate driving signal to an Nth horizontal scanning line Gn of an display area; wherein the Nth cascaded GOA unit comprises a pull-up assembly, a pull-up control assembly, a pull-down maintaining assembly, a download assembly and a bootstrap capacitor assembly; the pull-up assembly, the pull-down maintaining assembly, and the bootstrap capacitor assembly are all electrically coupled with an Nth gate signal node Qn and the Nth horizontal scanning line Gn; the pull-up control assembly and the download assembly are coupled with the Nth gate signal node Qn; wherein the pull-up control assembly comprises a first thin film transistor (TFT), a second TFT, and a third TFT; a source electrode of the first TFT and a drain electrode of the second TFT are both coupled with a drain electrode of the third TFT, a source electrode of the second TFT and a gate electrode of the third TFT are both coupled with the Nth gate signal node Qn, and a source electrode of the third TFT is coupled with the pull-down maintaining assembly; a first high frequency clock signal is input to a gate electrode of the first TFT coupled with a gate electrode of the second TFT; wherein the pull-down maintaining assembly is coupled with a reference low voltage source; when the Nth horizontal scanning line Gn is not active, the pull-down maintaining assembly conducts the Nth cascaded gate signal node and the Nth horizontal scanning line with the reference low voltage source to pull down voltage potentials of the Nth cascaded gate signal node Qn and the Nth horizontal scanning line Gn to a low level; the source electrode of the third TFT is conducted with the reference low voltage source to pull down the source electrode of the third TFT to the low level; wherein the pull-down maintaining assembly comprises two pull-down maintaining elements, each pull-down maintaining element comprises a fourth TFT, a sixth TFT, a seventh TFT, an eighth TFT, a ninth TFT, and a tenth TFT; wherein a low frequency clock signal is input to a drain electrode of the eighth TFT coupled with a drain electrode and a gate electrode of the seventh TFT; a first node is coupled to a source electrode of the seventh TFT, a gate electrode of the eighth TFT, and a drain electrode of the tenth TFT; a second node is couple with a source electrode of the eighth TFT, a drain electrode of the ninth TFT, a gate electrode of the fourth TFT, and a gate electrode of the sixth TFT; the source electrodes of the fourth TFT, the sixth TFT, and the tenth TFT are coupled; a first low voltage output by the reference low voltage source is input to the source electrodes of the fourth TFT, the sixth TFT, and the tenth TFT; a second low voltage output by the reference low voltage source is input to the source electrode of the ninth TFT; the Nth cascaded gate signal node Qn is couple with the drain electrode of the fourth TFT, a gate electrode of the ninth TFT, and a gate electrode of the tenth TFT; the drain electrode of the sixth TFT is coupled with the source electrode of the third TFT and the Nth horizontal scanning line Gn, respectively; two low frequency clock signals are input to the two pull-down maintaining elements, respectively, and phases of the two low frequency clock signals are inverted; wherein the two low frequency clock signals are input to the two pull-down maintaining elements by different common metal wires, respectively; wherein the download assembly comprises an eleventh TFT; a second high frequency clock signal is input to a drain electrode of the eleventh TFT, a gate electrode of the eleventh TFT is coupled with the Nth gate signal node Qn, and a source electrode of the eleventh TFT outputs an Nth download signal STn; wherein each pull-down maintaining element further comprises a fifth TFT; a gate electrode of the fifth TFT is coupled with the second node, a drain electrode of the fifth TFT is coupled with the source electrode of the eleventh TFT, and the first low voltage is input to a source of the fifth TFT; wherein value of the second low voltage is less than value of the first low voltage; wherein the pull-up assembly comprises a twelfth TFT, where a second high frequency clock signal is input to a drain electrode of the twelfth TFT, a source electrode of the twelfth TFT is coupled with the Nth horizontal scanning line Gn, and a gate electrode of the twelfth TFT is coupled with the Nth gate signal node, wherein the first high frequency clock signal and the second high frequency clock signal are inverted; wherein the bootstrap capacitor assembly comprises a bootstrap capacitor, a first end of the bootstrap capacitor is coupled with the Nth level gate signal node Qn, and a second end of the bootstrap capacitor Cb is coupled to the Nth horizontal scanning line Gn; wherein the first TFT, the second TFT, the third TFT are all made of indium gallium zinc oxide (IGZO).

12. A liquid crystal display (LCD) device, comprising the gate driver on array (GOA) driving circuit as in claim 10.

* * * * *